United States Patent
Lo et al.

(10) Patent No.: US 12,451,708 B2
(45) Date of Patent: Oct. 21, 2025

(54) DOCKING STRUCTURE AND A DOCKING DEVICE COMPRISING THE SAME

(71) Applicant: INDUSTRIAL TECHNOLOGY RESEARCH INSTITUTE, Hsinchu (TW)

(72) Inventors: Shu Yen Lo, Zhubei (TW); Jyun-Liang Pan, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 568 days.

(21) Appl. No.: 17/994,717

(22) Filed: Nov. 28, 2022

(65) Prior Publication Data
US 2024/0178681 A1    May 30, 2024

(51) Int. Cl.
*G06F 1/16*    (2006.01)
*H02J 7/00*    (2006.01)
*H05K 5/00*    (2025.01)
*H05K 7/00*    (2006.01)

(52) U.S. Cl.
CPC .................. *H02J 7/0042* (2013.01)

(58) Field of Classification Search
CPC ...... H02J 7/0042; H02J 7/0044; H02J 7/0045; G06F 1/1632; G06F 1/1654
See application file for complete search history.

(56) References Cited

U.S. PATENT DOCUMENTS

| | | | |
|---|---|---|---|
| 8,390,251 B2 | 3/2013 | Cohen et al. | |
| 11,048,105 B1 * | 6/2021 | Roy | G02F 1/0121 |
| 2007/0267998 A1 | 11/2007 | Cohen et al. | |
| 2018/0375355 A1 | 12/2018 | Wu et al. | |

(Continued)

FOREIGN PATENT DOCUMENTS

| | | |
|---|---|---|
| CN | 204668542 U | 9/2015 |
| CN | 205304328 U | 6/2018 |

(Continued)

OTHER PUBLICATIONS

Kim et al., "Development of Docking System for Mobile Robots Using Cheap Infrared Sensors," 1st International Conference on Sensing Technology, Nov. 21-23, 2005, pp. 287-291.

(Continued)

*Primary Examiner* — Anthony M Haughton
(74) *Attorney, Agent, or Firm* — Birch, Stewart, Kolasch & Birch, LLP

(57) ABSTRACT

A docking structure includes a first base and a second base connected to the first base; a first electrode group arranged in parallel and combined on an insulating block; and a second electrode group arranged in parallel with the first electrode group, wherein the second electrode group is used for bonding the first electrode group, the second electrode group is combined with the first base and has freedom in a first direction, moves in the first direction by a first elastic structure; the first base is combined with the second base and has freedom in a second direction different from the first direction. A second elastic structure is connected between the first and second bases. A first plane of the first electrode group and a second plane of the second electrode group are kept in parallel surface contact during docking the first and second electrode groups.

16 Claims, 14 Drawing Sheets

(56) References Cited

U.S. PATENT DOCUMENTS

| | | | |
|---|---|---|---|
| 2021/0037306 A1* | 2/2021 | Lehnert | H04R 5/04 |
| 2021/0228039 A1 | 7/2021 | Brouwers et al. | |
| 2021/0229562 A1 | 7/2021 | Naganishi et al. | |
| 2022/0158466 A1* | 5/2022 | Choi | B60L 53/80 |
| 2023/0339341 A1* | 10/2023 | Jeffries | B60L 53/16 |
| 2023/0339347 A1* | 10/2023 | Lai | H01R 13/703 |
| 2023/0369872 A1* | 11/2023 | Lai | B60L 53/31 |
| 2024/0298952 A1* | 9/2024 | Al-Ali | A61B 5/02233 |

FOREIGN PATENT DOCUMENTS

| | | |
|---|---|---|
| CN | 111469690 A | 7/2020 |
| CN | 210985081 U | 7/2020 |
| CN | 111619379 A | 9/2020 |
| CN | 111956125 A | 11/2020 |
| CN | 212784040 U | 3/2021 |
| CN | 112590578 A | 4/2021 |
| CN | 215348699 U | 12/2021 |
| CN | 113972531 A | 1/2022 |
| CN | 216805129 U | 6/2022 |
| CN | 216958711 U | 7/2022 |
| JP | 6870335 B2 | 5/2021 |
| TW | 201405975 A | 2/2014 |
| TW | 202112031 A | 3/2021 |
| TW | 202131592 A | 8/2021 |

OTHER PUBLICATIONS

Luo et al., "Multi-Sensor Fusion for Reduced Uncertainty in Autonomous Mobile Robot Docking and Recharging," The 2009 IEEE/RSJ International Conference on Intelligent Robots and Systems, Oct. 11-15, 2009, pp. 2203-2208.

Okunevich et al., "DeltaCharger: Charging Robot with Inverted Delta Mechanism and CNN-Driven High Fidelity Tactile Perception for Precise 3D Positioning," IEEE Robotics and Automation Letters, vol. 6, No. 4, Oct. 2021, pp. 7604-7610.

Roh et al., "Flexible Docking Mechanism Using Combination of Magnetic Force with Error-Compensation Capability," 4th IEEE Conference on Automation Science and Engineering, Aug. 23-26, 2008, pp. 697-702.

Roh et al., "Flexible Docking Mechanism with Error-Compensation Capability for Auto Recharging System of Mobile Robot," International Journal of Control, Automation, and Systems, vol. 6, No. 5, Oct. 2008, pp. 731-739.

Silverman et al., "Staying Alive: A Docking Station for Autonomous Robot Recharging," Proceedings of the 2002 IEEE, International Conference on Robotics & Automation, May 2002, pp. 1050-1055.

Wu et al., "Robot Docking Station for Automatic Battery Exchanging and Charging," Proceedings of the 2008 IEEE, International Conference on Robotics and Biomimetics, Feb. 21-26, 2009, pp. 1043-1046.

Taiwanese Office Action and Search Report for Taiwanese Application No. 111145478, dated Oct. 4, 2023.

* cited by examiner

DOCKING STRUCTURE AND A DOCKING DEVICE COMPRISING THE SAME

TECHNICAL FIELD

The disclosure relates to a docking structure and a docking device comprising the same, and more particularly to a docking structure comprising electrodes and a docking device comprising the same.

BACKGROUND

Recently, the demand for an autonomous vehicle is getting higher and higher. Generally speaking, the autonomous vehicle needs to be docked with a service station to provide power to the autonomous vehicle. However, the conventional docking structure applied to the autonomous vehicle and the service station still has the possibility of poor docking. Therefore, there is still an urgent need to develop a docking structure that can improve the above problems.

SUMMARY

The disclosure relates to a docking structure and a docking device including the docking structure. The docking structure of the present disclosure can maintain parallel surface contact between the first plane of the first electrode group and the second plane of the second electrode group during docking the first electrode group and the second electrode group, so a translation error and a rotation error during docking can be tolerated at the same time.

According to one embodiment, a docking structure is provided. The docking structure comprises: a first base and a second base connected to the first base; a first electrode group arranged in parallel and combined on an insulating block; and a second electrode group arranged in parallel with the first electrode group, wherein the second electrode group is used for bonding the first electrode group, the second electrode group is combined with the first base and has freedom in a first direction, moves in the first direction by a first elastic structure; the first base is combined with the second base and has freedom in a second direction different from the first direction. A second elastic structure is connected between the first base and the second base. A first plane of the first electrode group and a second plane of the second electrode group are kept in parallel surface contact during docking the first electrode group and the second electrode group to each other.

According to another embodiment, a docking device is provided. The docking device comprises: an autonomous vehicle and a service station, the autonomous vehicle moving towards the service station, making the autonomous vehicle and the service station docking with each other; and a docking structure, comprising: a first base and a second base connected to the first base; a first electrode group arranged in parallel and combined on an insulating block; and a second electrode group arranged in parallel with the first electrode group, wherein the second electrode group is used for bonding the first electrode group, the second electrode group is combined with the first base and has freedom in a first direction, and moves in the first direction by a first elastic structure; the first base is combined with the second base and has freedom in a second direction different from the first direction, wherein a second elastic structure is connected between the first base and the second base; wherein a first plane of the first electrode group and a second plane of the second electrode group are kept in parallel surface contact during docking the first electrode group and the second electrode group; wherein the first electrode group is disposed on the autonomous vehicle, the second electrode group, the first base and the second base are disposed on the service station, or the first electrode group is disposed on the service station, and the second electrode group, the first base and the second base are disposed on the autonomous vehicle.

In order to have a better understanding of the above-mentioned and other aspects of the present disclosure, the following embodiments are given, and the accompanying drawings are described in detail as follows:

DETAILED DESCRIPTION

Figure 1A:
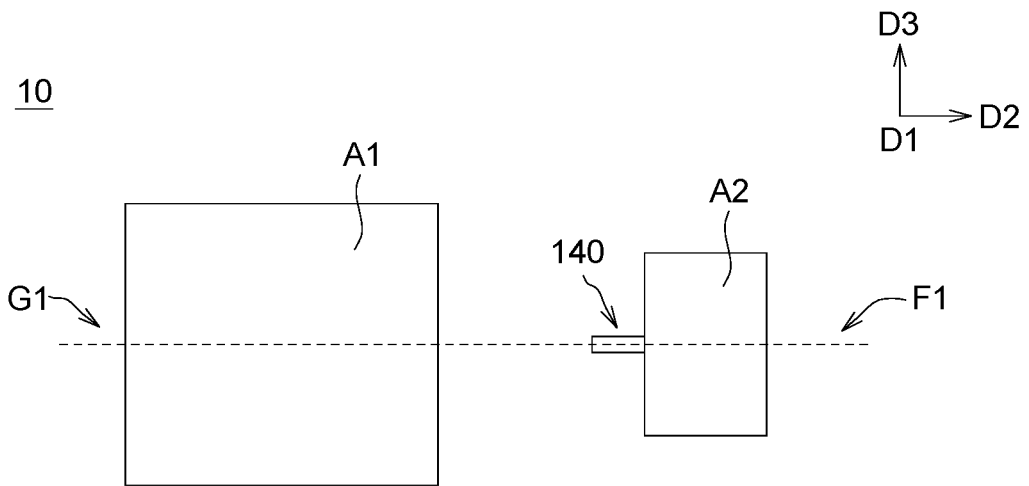
FIG. 1A illustrates a top view of a docking device according to an embodiment of the present disclosure.

In the following, related embodiments are proposed, and the structure proposed in this disclosure is described in detail in conjunction with the drawings. However, the present disclosure is not limited thereto. The descriptions in the embodiments, such as the detailed structure, the steps of the manufacturing method and the application of materials, etc., are for illustration purposes only, and the protection scope of the present disclosure is not limited to the above-mentioned embodiments.

Meanwhile, it should be noted that the present disclosure does not show all possible embodiments. Those skilled in the art may change and modify the structures and manufacturing methods of the embodiments without departing from the spirit and scope of the present disclosure, so as to meet the needs of practical applications. Therefore, other implementations not proposed in this disclosure may also be applicable. Furthermore, the drawings are simplified to clearly illustrate the content of the embodiments, and the scale in the drawings is not drawn according to the actual product. Therefore, the specification and drawings are only used to describe the embodiments, rather than to limit the protection scope of the present disclosure. The same or similar reference numerals are used to represent the same or similar components.

An autonomous vehicle of the present disclosure can be applied to the autonomous vehicle with a large load (such as a robot, an electric vehicle or the like), but the present disclosure is not limited thereto. When the autonomous vehicle with a large load is automatically docked with the service station, it may be easy to cause a docking error between the autonomous vehicle and the service station due to the large inertia of the large-load type, resulting in a poor electrical contact of electrodes between the autonomous vehicle and the service station, which leads to problems such as poor charging efficiency or poor information transmission efficiency, and overheating of the electrodes. In order to improve the above problems, the positioning accuracy between the autonomous vehicle and the service station can be improved. However, if the positioning accuracy is to be improved, high-cost sensors and mobile control modules may be required, or the time required for positioning may be extended, or the number of repositioning is increased, and the environmental requirements (such as lighting) must also be improved. Furthermore, due to the large inertia of autonomous vehicles, the effect of improving positioning accuracy is limited.

Compared with the current docking structure, the docking structure disclosed in the present disclosure has better tolerance for the docking error between the autonomous vehicle and the service station, even if there are positioning errors (such as translation errors and rotation errors) when the autonomous vehicle and the service station are docked, the electrode groups of the docking structure can still maintain good surface contact.

Figure 1B:
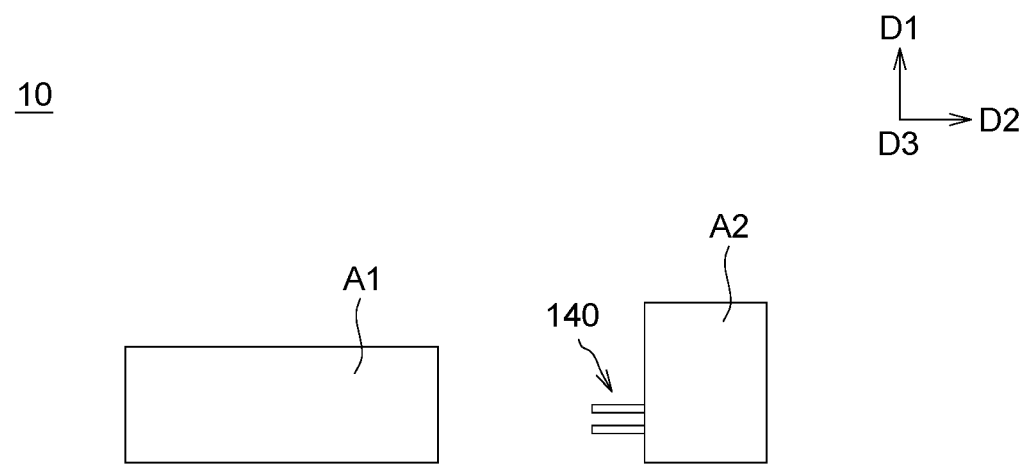
FIG. 1B illustrates a side view of the docking device according to an embodiment of the present disclosure.
Figure 1C:
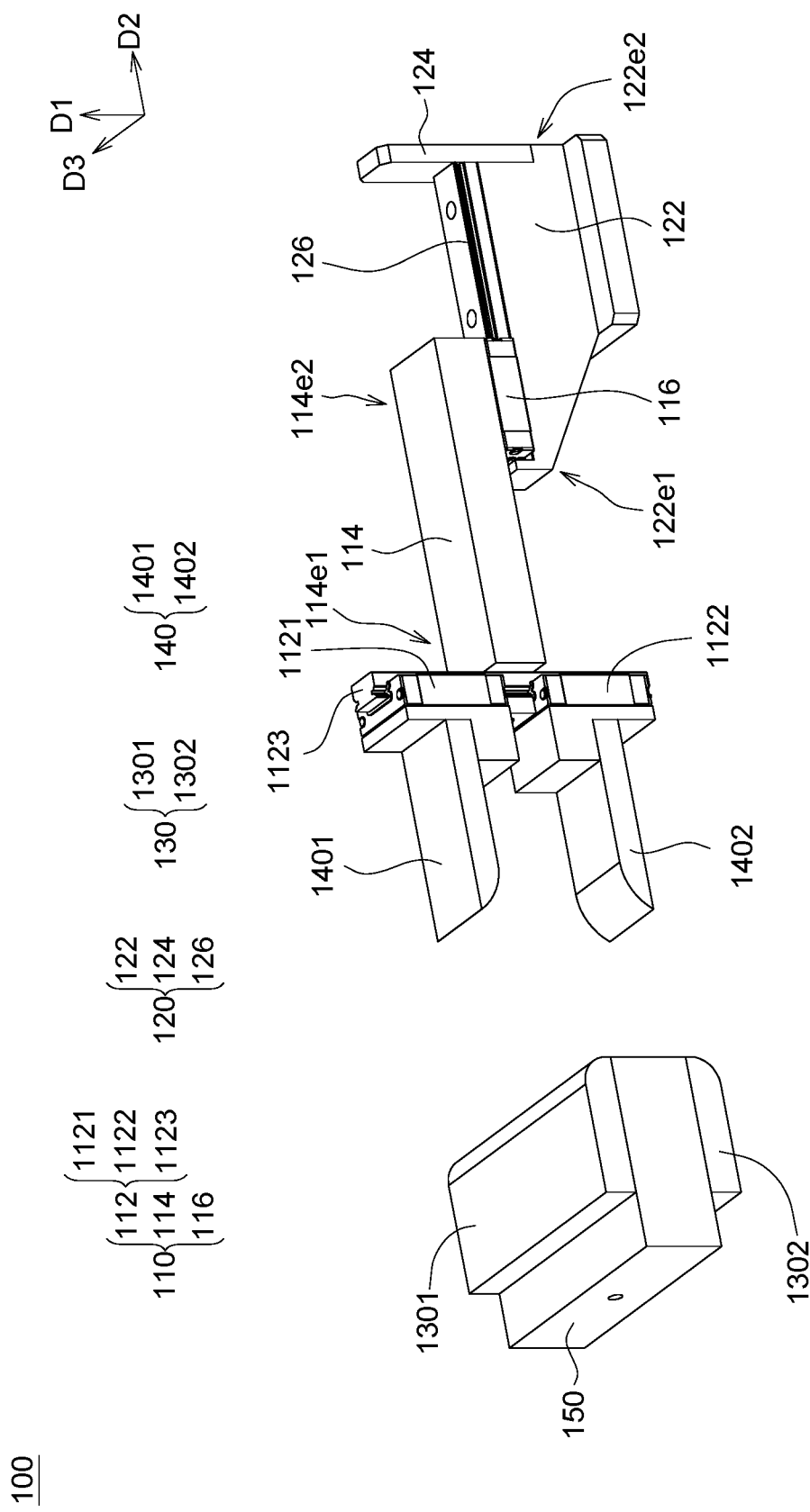
FIG. 1C illustrates a stereo view of a docking structure included in the docking device according to an embodiment of the present disclosure.

FIG. 1A illustrates a top view of a docking device 10 according to an embodiment of the present disclosure, for example, corresponding to a plane formed by a second direction D2 and a third direction D3. FIG. 1B illustrates a side view of the docking device 10 according to an embodiment of the present disclosure, for example, corresponding to a plane formed by a first direction D1 and the second direction D2. FIG. 1C illustrates a stereo view of a docking structure 100 included in the docking device 10 according to an embodiment of the present disclosure. The first direction D1, the second direction D2 and the third direction D3 are different from each other. For example, the first direction D1, the second direction D2 and the third direction D3 are perpendicular to each other, but the present disclosure is not limited thereto.

Please refer to FIGS. 1A and 1B at the same time. The docking device 10 comprises an autonomous vehicle A1 and a service station A2. The autonomous vehicle A1 can automatically move towards the service station A2, so that the autonomous vehicle A1 and the service station A2 can be connected to each other by using the docking structure 100 as shown in FIG. 1C to provide electrical and/or informational exchange. FIG. 1A illustrates, for example, that a central symmetry axis G1 of the autonomous vehicle A1 and the central symmetry axis F1 of the service station A2 coincide with each other, that is, there is no positioning error (such as translation error and rotation error) when the autonomous vehicle A1 and the service station A2 are docked. The central symmetry axis G1 is defined as the geometric center of the first electrode group (the first electrode group 130 as shown in FIG. 1C) included in the autonomous vehicle A1; the central symmetry axis F1 is defined as the geometric center included in the service station A2 of the second electrode group (the second electrode group 140 as shown in FIG. 1C); when there is no positioning error, the extension direction of the central symmetry axis G1 and the extension direction of the central symmetry axis F1 are, for example, parallel to the second direction D2. As shown in FIG. 1B, the service station A2 can comprise an adjustable stand (not shown) at the bottom. The adjustable stand can, for example, adjust the horizontal height of the service station A2 (for example, the height in the first direction D1), so that there may be no horizontal error between the autonomous vehicle A1 and the service station A2 without other disturbances (such as an uneven road surface).

Please refer to FIG. 1C, the docking structure 100 comprises a first base 110, a second base 120 connected to the first base 110, a first electrode group 130 and a second electrode group 140. The first electrode group 130 (for example, including a pair of electrodes) is arranged in parallel and combined on an insulating block 150. The second electrode group 140 (for example, including a pair of electrodes) is arranged in parallel with the first electrode group 130, wherein the second electrode group 140 is used for bonding the first electrode group 130 to provide electrical and/or informational exchange. The second electrode group 140 is combined with the first base 110 and has freedom in the first direction D1. The first base 110 is combined with the second base 120 and has freedom in the second direction D2.

The first electrode group 130 comprises a first upper electrode 1301 and a first lower electrode 1302 respectively disposed on an upper surface and a lower surface of the insulating block 150. The second electrode group 140 comprises a second upper electrode 1401 and a second lower electrode 1402. The first upper electrode 1301 corresponds to the second upper electrode 1401, and the first lower electrode 1302 corresponds to the second lower electrode 1402. That is, when the autonomous vehicle A1 is docked with the service station A2, in order to make the first electrode group 130 and the second electrode group 140 dock with each other, the first electrode group 130 enters the space between the second electrode group 140 (that is, in the space between the second upper electrode 1401 and the second lower electrode 1402). The first upper electrode 1301 is configured to be in electrical contact with the second upper electrode 1401, and the first lower electrode 1302 is configured to be in electrical contact with the second lower electrode 1402. When the first electrode group 130 enters the space between the second upper electrode 1401 and the second lower electrode 1402, the second upper electrode 1401 can move upward (that is, move upward parallel to the first direction D1), and the second lower electrode 1402 can move downwards (that is, move downwards parallel to the first direction D1) to adjust the distance between the second upper electrode 1401 and the second lower electrode 1402, so that the first electrode group 130 can be accommodated in the space between the second upper electrode 1401 and the second lower electrode 1402. In one embodiment, the second electrode group 140 can move in the first direction D1 through a first elastic structure (as shown in FIGS. 2A-2D), which can provide a rebound resilience, forming a contact force between the first electrode group 130 and the second electrode group 140 (details will be described later).

According to some embodiments, the first base 110 comprises a clamping portion 112, a rod-shaped portion 114 and a protruding portion 116. A first end 114e1 of the rod-shaped portion 114 is connected to the clamping portion 112, and a second end 114e2 of the rod-shaped portion 114 is connected to the protruding portion 116. The first end 114e1 is opposite to the second end 114e2, and the first end 114e1 is closer to the second electrode group 140 than the second end 114e2. For example, the protruding portion 116 is in contact with the lower surface of the second end 114e2 of the rod-shaped portion 114. The clamping portion 112 comprises an upper clamping member 1121, a lower clamping member 1122 and an extension pillar 1123 extending along the first direction D1. The upper clamping member 1121 and the lower clamping member 1122 are respectively connected to the second upper electrode 1401 and the second lower electrode 1402. The upper clamping member 1121 and the lower clamping member 1122 are movably engaged with the extension pillar 1123, and can drive the second upper electrode 1401 and the second lower electrode 1402 to move in the first direction D1, such as making the second upper electrode 1401 and the second lower electrode 1402 be separated from each other or close to each other in the first direction D1. The second base 120 comprises a body portion 122, a fixing portion 124 and a groove 126. The groove 126 is formed on an upper side of the body portion 122 to allow the protruding portion 116 of the first base 110 to slide, for example, to slide in the second direction D2. It should be understood that the connection between the first base 110 and the second base 120 is not limited to the one shown in FIG. 1C. The body portion 122 has a front end 122e1 and a rear end 122e2 opposite to the front end 122e1, and the front end 122e1 is closer to the second electrode group 140 than the rear end 122e2. The fixing portion 124 is connected to the rear end 122e2 of the body portion 122, and the fixing portion 124 protrudes from the body portion 122 along the first direction D1, for example.

According to an embodiment, the first electrode group 130 and the insulating block 150 are disposed on the autonomous vehicle A1, and the second electrode group 140, the first base 110 and the second base 120 are disposed on the service station A2. Most of the drawings in the present disclosure are drawn according to the present embodiment, but the present disclosure is not limited thereto. According to another embodiment, the first electrode group 130 and the insulating block 150 are disposed on the service station A2, and the second electrode group 140, the first base 110 and the second base 120 are disposed on the autonomous vehicle A1.

Furthermore, the first elastic structure and the second elastic structure are omitted in FIG. 1C. Different embodiments of the first elastic structure and the second elastic structure are shown in FIGS. 2A-2D. The second electrode group 140 can move in the first direction D1 through the first elastic structure. The first base 110 moves in the second direction D2 through the second elastic structure. It should be understood that the embodiments of the first elastic structure and the second elastic structure of the present disclosure are not limited to the embodiments shown in FIGS. 2A-2D.

FIGS. 2A-2D illustrate side views of docking structures 100-400 according to some embodiments of the present disclosure, for example, corresponding to a plane formed by the first direction D1 and the second direction D2. In the embodiment shown in FIGS. 2A to 2D, the first electrode group 130 and the insulating block 150 are disposed on the autonomous vehicle A1, and the second electrode group 140, the first base 110 and the second base 120 are disposed on the service station A2, but the present disclosure is not limited thereto.

Figure 2A:
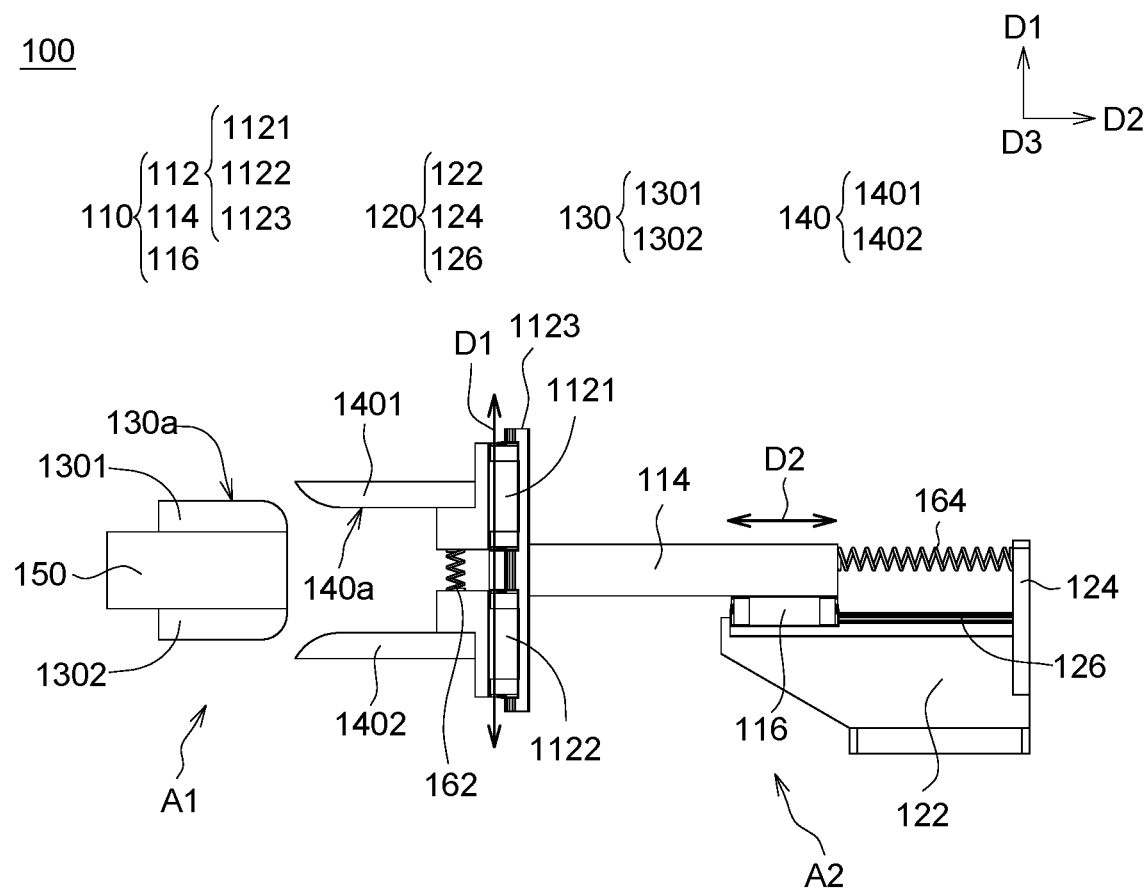
FIGS. 2A-2D illustrate side views of docking structures according to some embodiments of the present disclosure.

Please refer to FIG. 2A, in the docking structure 100, the second electrode group 140 can move in the first direction D1 through the first elastic structure 162. The first base 110 can move in the second direction D2 through the second elastic structure 164. The first elastic structure 162 can be connected to the upper clamping member 1121 and the lower clamping member 1122. The second elastic structure 164 can be connected between the first base 110 and the second base 120, for example, connected to the rod-shaped portion 114 and the fixing portion 124. The connecting position between the first elastic structure 162 and the upper clamping member 1121 and the connecting position between the first elastic structure 162 and the lower clamping member 1122 are not limited to the positions shown in FIG. 2A, as long as the positions that the first elastic structure 162 can drive the upper clamping member 1121, the lower clamping member 1122 and the second electrode group 140 thereon to move in the first direction D1. Similarly, the connecting position between the second elastic structure 164 and the rod-shaped portion 114 and the connecting position between the second elastic structure 164 and the fixing portion 124 are not limited to the positions shown in FIG. 2A, as long as the positions that the second elastic structure 164 can drive the first base 110 to move in the second direction D2. In one embodiment, the first elastic structure 162 and the second elastic structure 164 may respectively comprise an elastic recovery mechanism to provide a rebound resilience.

According to an embodiment of the present disclosure, the docking structure 100 can allow the docking error between the first electrode group 130 and the second electrode group 140 by the arrangement of two groups of electrode groups (i.e. the first electrode group 130 and the second electrode group 140) arranged in parallel to each other and elastic structures (such as the first elastic structure 162 and the second electrode group). For example, the docking process of the first electrode group 130 and the second electrode group 140 is shown in FIGS. 3A-3B.

Figure 3A:
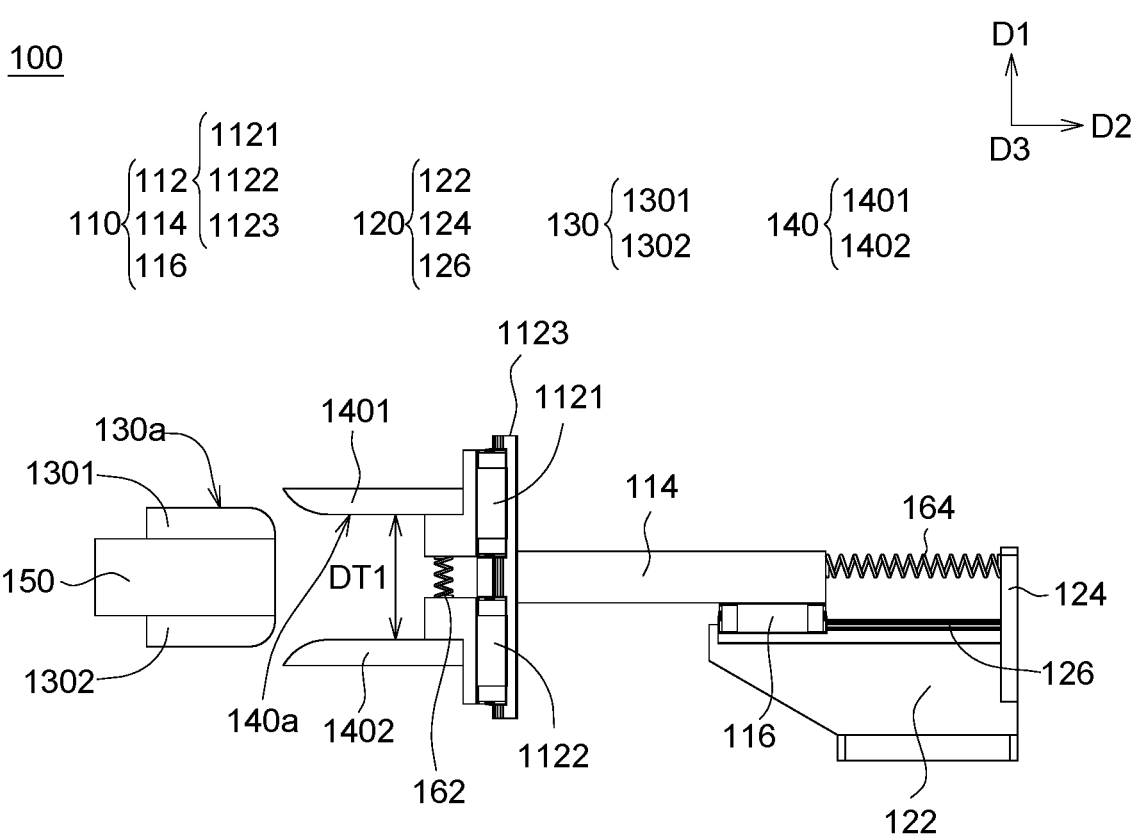
FIGS. 3A-3C illustrate successive steps of docking a first electrode group and a second electrode group in the docking structure according to an embodiment of the present disclosure.
Figure 3B:
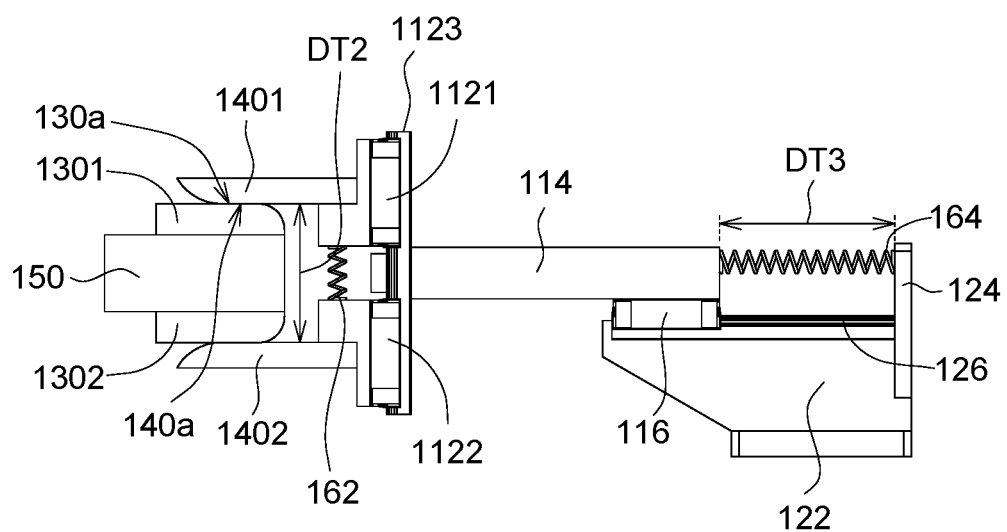
Figure 3C:
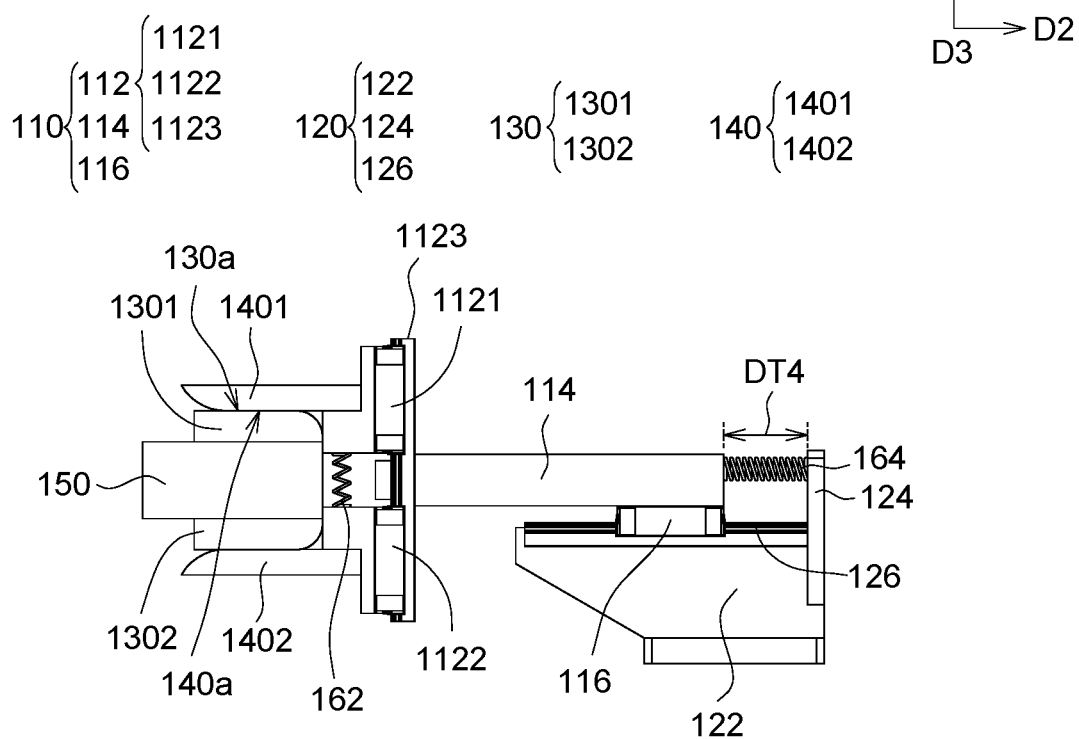

Please refer to FIGS. 3A-3C, which illustrate the successive steps of docking the first electrode group 130 and the second electrode group 140 in the docking structure 100 according to an embodiment of the present disclosure.

As shown in FIG. 3A, in the docking process of the first electrode group 130 and the second electrode group 140, the first electrode group 130 needs to enter the space between the second electrode group 140. For example, the first electrode group 130 may move toward the first electrode group 140 along the second direction D2. Before the first electrode group 130 enters the space between the second electrode group 140, there may be a distance DT1 between the second electrode group 140 (that is, between the lower surface of the second upper electrode 1401 and the upper surface of the second lower electrode 1402) in the first direction D1. In one embodiment, a height of the first electrode group 130 (i.e. the height between the upper surface of the first upper electrode 1301 and the lower surface of the first lower electrode 1302) in the first direction D1 may be slightly greater than the distance DT1.

As shown in FIG. 3B, when the first electrode group 130 moves into the space between the second electrode group 140 along the second direction D2, the second upper electrode 1401 on the upper clamping member 1121 and the second lower electrodes 1402 on the lower clamping member 1122 first move up and down respectively, so that the first electrode group 130 can be accommodated in the space between the second electrode group 140. Since the first elastic structure 162 comprises an elastic recovery mechanism, it can provide the rebound resilience for the second electrode group 140, that is, to make the second upper electrode 1401 on the upper clamping member 1121 and the second lower electrode 1402 on the lower clamping member 1122 move down and up respectively, so that there is a contact force between a first plane 130a of the first electrode group 130 and a second plane 140a of the second electrode group 140. According to an embodiment, after the first electrode group 130 enters the space between the second electrode group 140, there can be a distance DT2 between the second electrode group 140 (that is, between the lower surface of the second upper electrode 1401 and the upper surface of the second lower electrode 1402) in the first direction D1, and the distance DT2 may be greater than the distance DT1.

In detail, the rebound resilience provided by the first elastic structure 162 not only forms a contact force between the upper surface of the first upper electrode 1301 (i.e., the first plane 130a) and the lower surface of the second upper electrode 1401 (i.e., the second plane 140a), but also forms a contact force between the lower surface of the first lower electrode 1302 and the upper surface of the second lower electrode 1402, so that the first plane 130a of the first electrode group 130 (that is, the upper surface of the first upper electrode 1301) and the second plane 140a of the second electrode group 140 (that is, the lower surface of the second upper electrode 1401) can be kept in parallel surface contact, and the lower surface of the first lower electrode 1302 and the upper surface of the second lower electrode 1402 can be kept in parallel surface contact. For example, the first plane 130a of the first electrode group 130 (i.e., the upper surface of the first upper electrode 1301), the second plane 140a of the second electrode group 140 (i.e., the lower surface of the second upper electrode 1401), the lower surface of the first lower electrode 1302 and the upper surface of the second lower electrode 1402 can be kept in parallel to each other (for example, parallel to the second direction D2). The normal direction of the first plane 130a of the first electrode group 130 (i.e. the upper surface of the first upper electrode 1301), the second plane 140a of the second electrode group 140 (i.e., the lower surface of the second upper electrode 1401), the lower surface of the first lower electrode 1302 and the upper surface of the second lower electrode 1402 may be parallel to the first direction D1.

As shown in FIG. 3C, when the first electrode group 130 moves into the space between the second electrode group 140 along the second direction D2, since the first base 110 has freedom in the second direction D2 and the second elastic structure 164 can provide the rebound resilience in the second direction D2, a buffer can be provided when the first electrode group 130 and the second electrode group 140 are docked. As the first electrode group 130 is getting closer and closer to the first base 110 along the second direction D2, the first base 110 and the second electrode group 140 also slide along the second direction D2 as the first electrode group 130 is pushed, so as to prevent the first electrode group 130 from moving too far to vigorously impact the second electrode group 140. Also, there can be more time and space to adjust the contact between the first electrode group 130 and the second electrode group 140 and a proper surface contact can be maintained. According to an embodiment, before the docking step between the first electrode group 130 and the second electrode group 140 is completed, there is a distance DT3 between the rod-shaped portion 114 and the fixing portion 124 in the second direction D2 (as shown in FIG. 3B); after the docking step between the first electrode group 130 and the second electrode group 140 is completed, there is a distance DT4 between the rod-shaped portion 114 and the fixing portion 124 in the second direction D2 (as shown in FIG. 3C), and the distance DT4 is smaller than the distance DT3.

From the foregoing contents, it can be known that the surface contact can be maintained between the first plane 130a of the first electrode group 130 (that is, the upper surface of the first upper electrode 1301) and the second plane 140a of the second electrode group 140 (that is, the lower surface of the second upper electrode 1401), and between the lower surface of the first lower electrode 1302 and the upper surface of the second lower electrode 1402, rather than the point contact or line contact by making two groups of electrode groups (i.e., the first electrode group 130 and the second electrode group 140) and elastic structures (such as the first elastic structure 162 and the second elastic structure 164) arranged in parallel to each other, regardless of whether there is a docking error between the first electrode group 130 and the second electrode group 140. Therefore, compared with the comparative example of the docking structure that cannot maintain the surface contact between the two electrode groups, the docking structure 100 of the present disclosure has a higher tolerance for docking errors, and the parallel surface contact between the first electrode group 130 and the second electrode group 140 can still be maintained under the circumstances that the docking error occurs. The contact area between the first electrode group 130 and the second electrode group 140 can be larger, so it can have better charging efficiency or information transmission efficiency.

Please refer back to FIG. 2B. A docking structure 200 is similar to the docking structure 100, and one of the differences between the docking structure 200 and the docking structure 100 lies in the arrangement of the first elastic structure 262, and other repeated parts will not be described in detail.

Figure 2B:
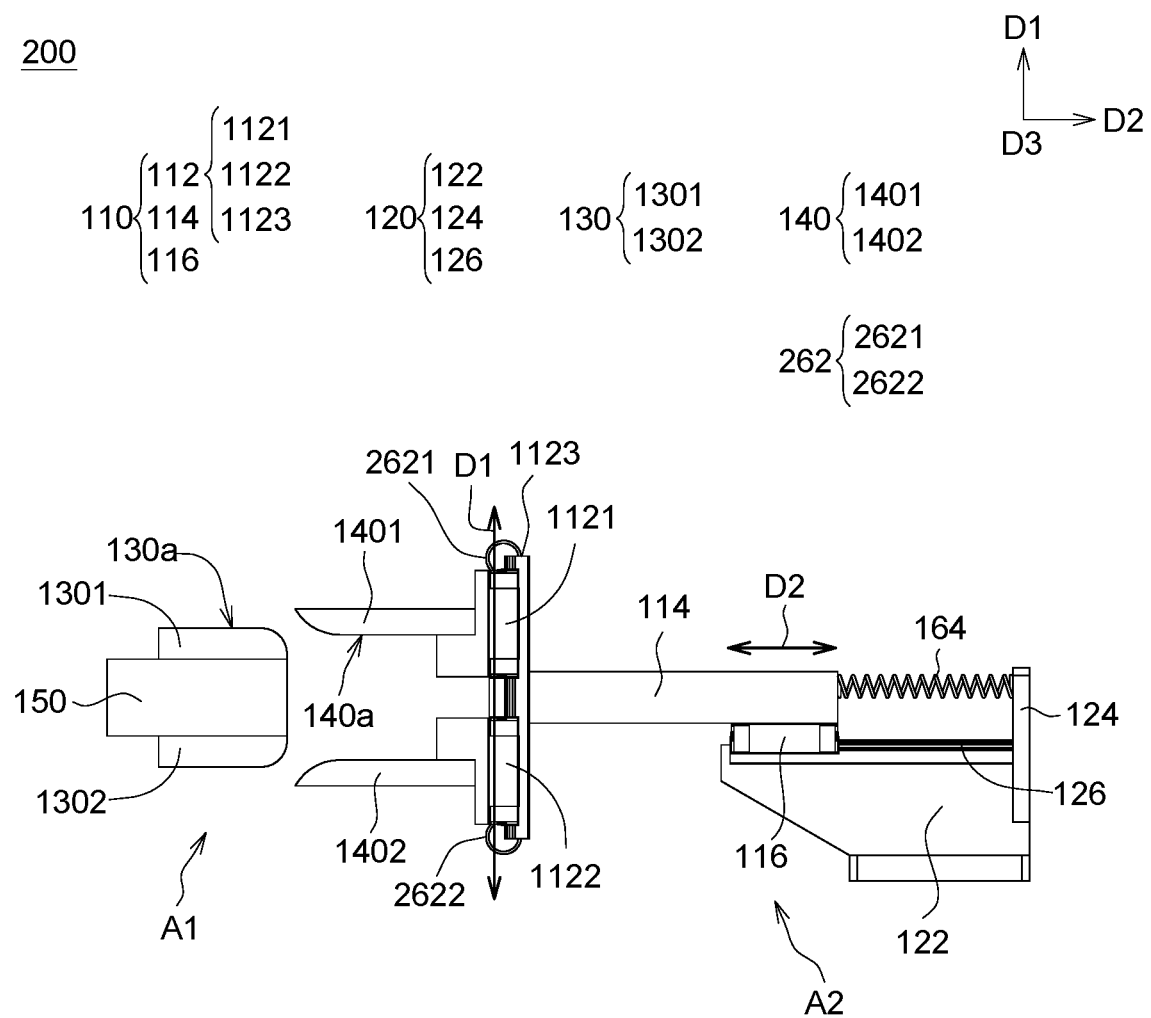

As shown in FIG. 2B, the first elastic structure 262 comprises an upper elastic member 2621 and a lower elastic member 2622. The upper elastic member 2621 is connected to the upper clamping member 1121 and the extension pillar 1123, for example, and the lower elastic member 2622 is connected to the lower clamping member 1122 and the extension pillar 1123. Alternatively, the upper elastic member 2621 is connected to the second upper electrode 1401 and the extension pillar 1123, and the lower elastic member 2622 is connected to the second lower electrode 1402 and the extension pillar 1123 (not shown in FIG. 2B, but the arrangement of the upper elastic member 2621 and the lower elastic member 2622 in FIG. 2B may be similar to the arrangement of the upper elastic member 2621' and the lower elastic member 2622' in FIG. 2D). The function of the first elastic structure 262 is the same or similar to the function of the first elastic structure 162, which will not be repeated here.

Figure 2C:
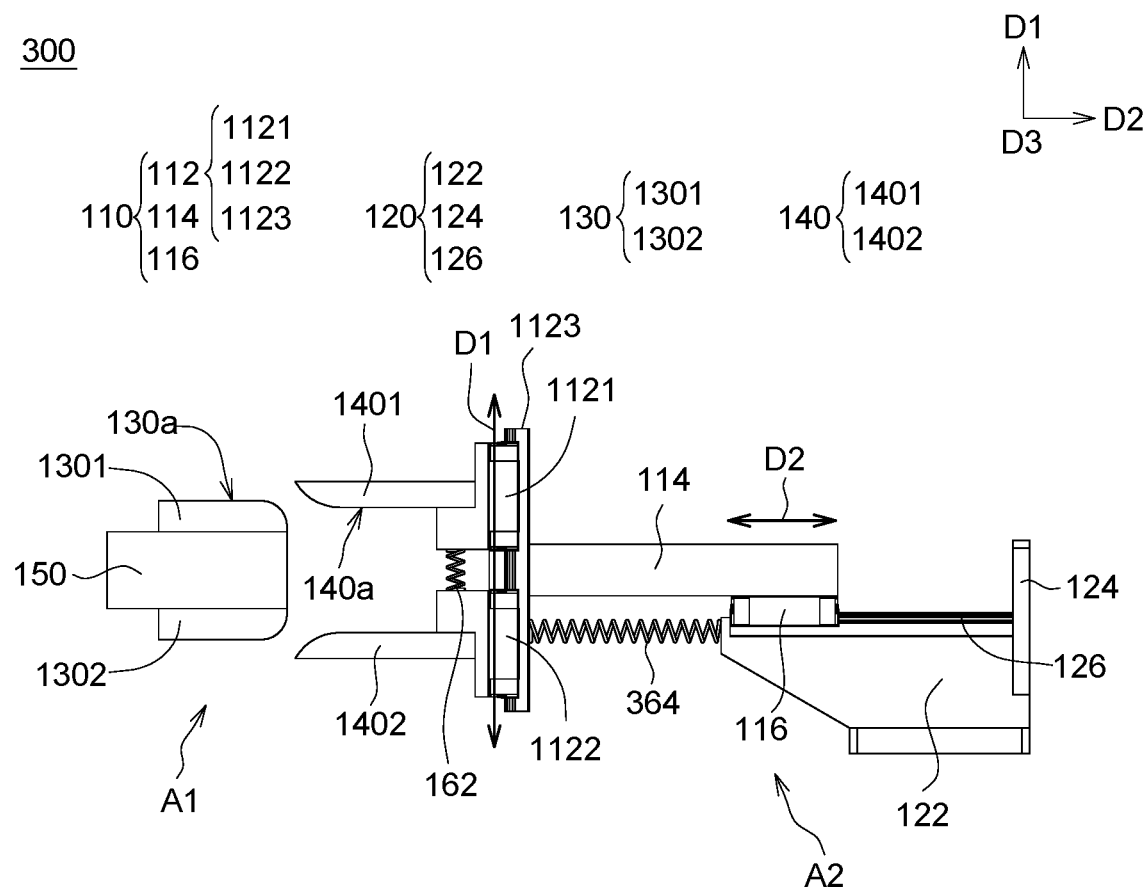

Please refer to FIG. 2C, the docking structure 300 is similar to the docking structure 100, one of the differences between the docking structure 300 and the docking structure 100 lies in the arrangement of the second elastic structure 364, and other repeated parts will not be described in detail.

As shown in FIG. 2C, the second elastic structure 364 is connected to the body portion 122 and the extension pillar 1123. The function of the second elastic structure 364 is the same as or similar to the function of the second elastic structure 164, which will not be repeated here.

Figure 2D:
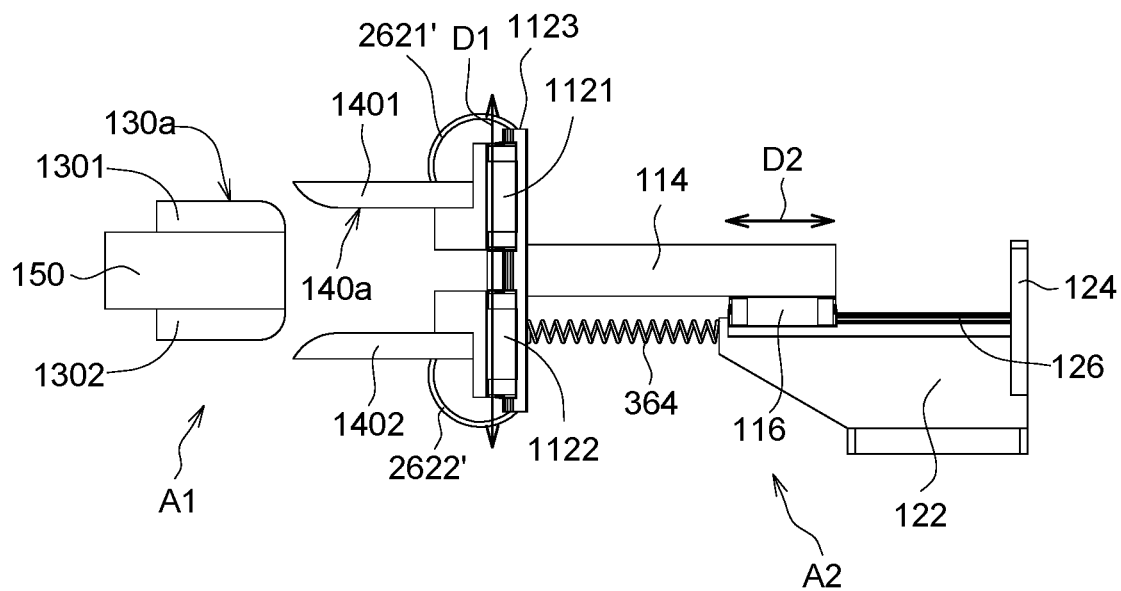

Please refer to FIG. 2D, the docking structure 400 is similar to the docking structure 100, one of the differences between the docking structure 400 and the docking structure 100 lies in the arrangement of the first elastic structure 262' and the second elastic structure 364, and other repeated parts will not be described in detail.

As shown in FIG. 2D, the first elastic structure 262' comprises an upper elastic member 2621' and a lower elastic member 2622', the upper elastic member 2621' is connected to the second upper electrode 1401 and the extension pillar 1123, and the lower elastic member 2622' is, for example, connected to the second lower electrode 1402 and the extension pillar 1123. Alternatively, the upper elastic member 2621' is, for example, connected to the upper clamping member 1121 and the extension pillar 1123, and the lower elastic member 2622' is, for example, connected to the lower clamping member 1122 and the extension pillar 1123 (not shown in FIG. 2D, but the arrangement of the upper elastic member 2621' and the lower elastic member 2622' in FIG. 2D can be similar to the arrangement of the upper elastic member 2621 and the lower elastic member 2622 in FIG. 2B, respectively). The second elastic structure 364 is connected to the body portion 122 and the extension pillar 1123. The function of the first elastic structure 262' is the same or similar to the function of the first elastic structure 162, and the function of the second elastic structure 364 is the same or similar to the function of the second elastic structure 164, which will not be repeated here.

According to some embodiments, all of the first elastic structures 162, 262, 262' and the second elastic structures 164, 364 may comprise an elastic recovery mechanism, such as a spring, a shrapnel, a flexible body with self-resilient force or other suitable elastic recovery mechanisms.

It should be understood that the docking structures 200-400 can also achieve the same technical means and effects as the docking structure 100 described above. That is to say, the docking structures 100 and 200-400 are more tolerant to docking errors, and the parallel surface contact between the first electrode group 130 and the second electrode group 140 can still be maintained under the circumstances that the docking error occurs, so that there is a larger contact area between the first electrode group 130 and the second electrode group 140. Therefore, the docking structures 100 and 200-400 can have better charging efficiency or information transmission efficiency.

The following FIGS. 4A-8C will further explain the docking error between the first electrode group 130 and the second electrode group 140. It should be noted that the illustration of the first elastic structure and the second elastic structure is omitted in FIGS. 4A-8C.

Figure 4A:
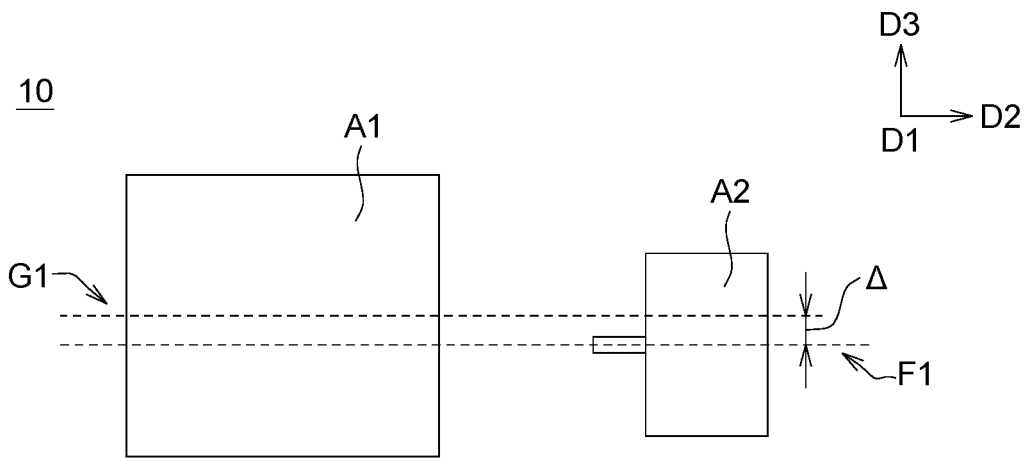
FIG. 4A illustrates a top view of the docking device when a translation error occurs.
Figure 4B:
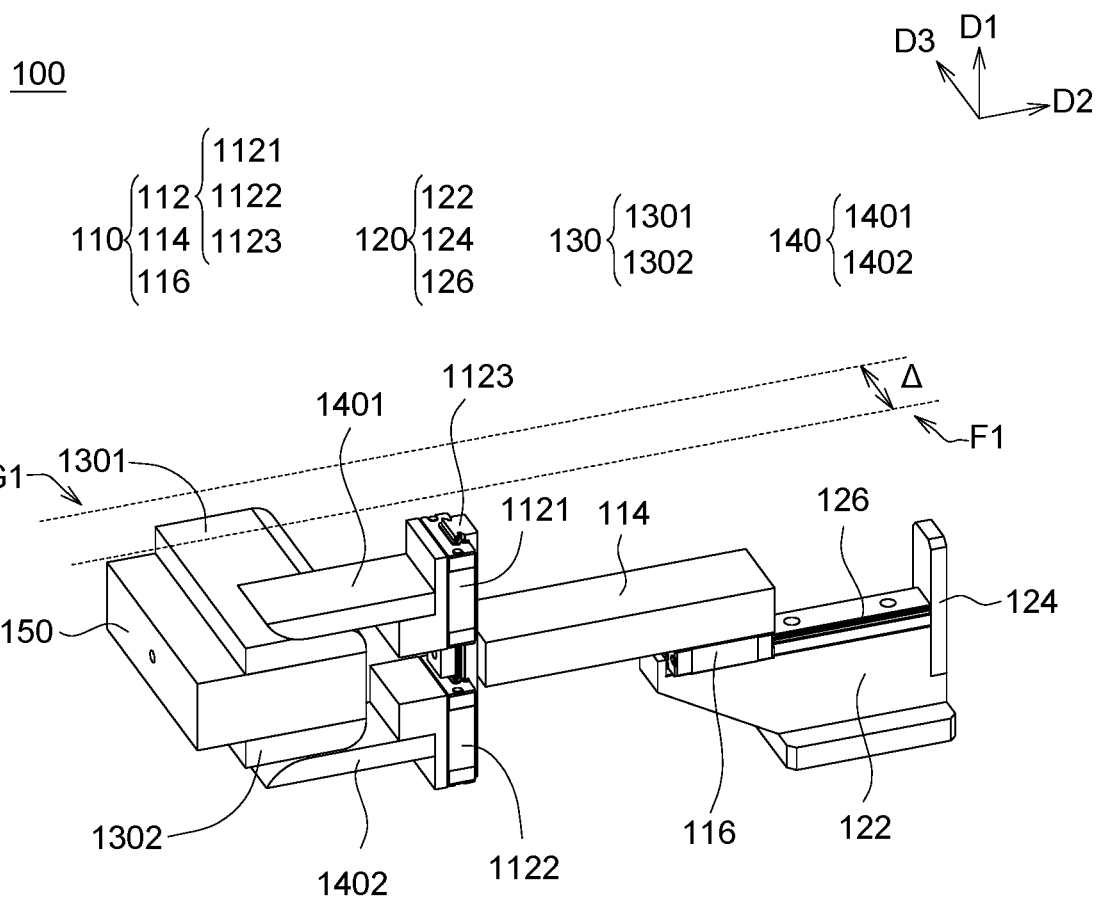
FIG. 4B illustrates a stereo view of the docking structure included in the docking device when a translation error occurs.
Figure 5A:
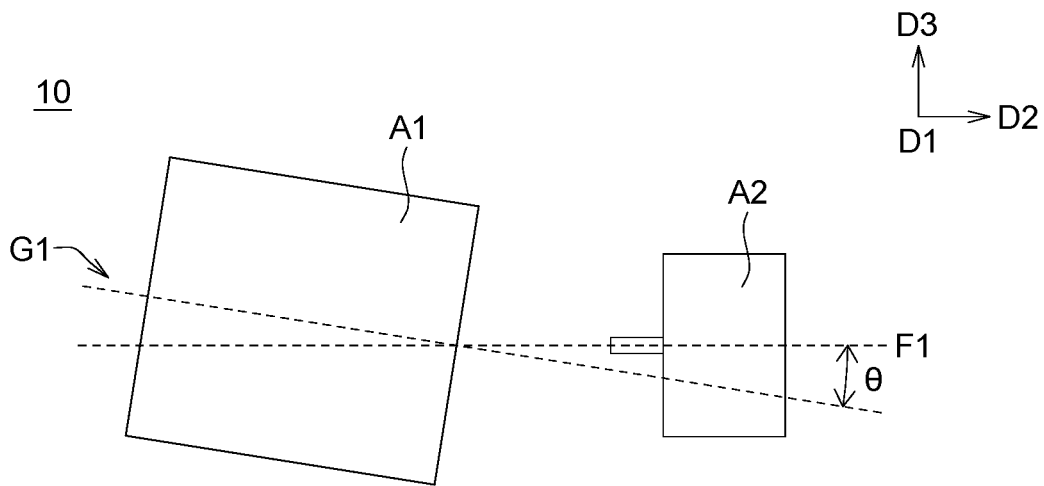
FIG. 5A illustrates a top view of the docking device when a rotation error occurs.
Figure 5B:
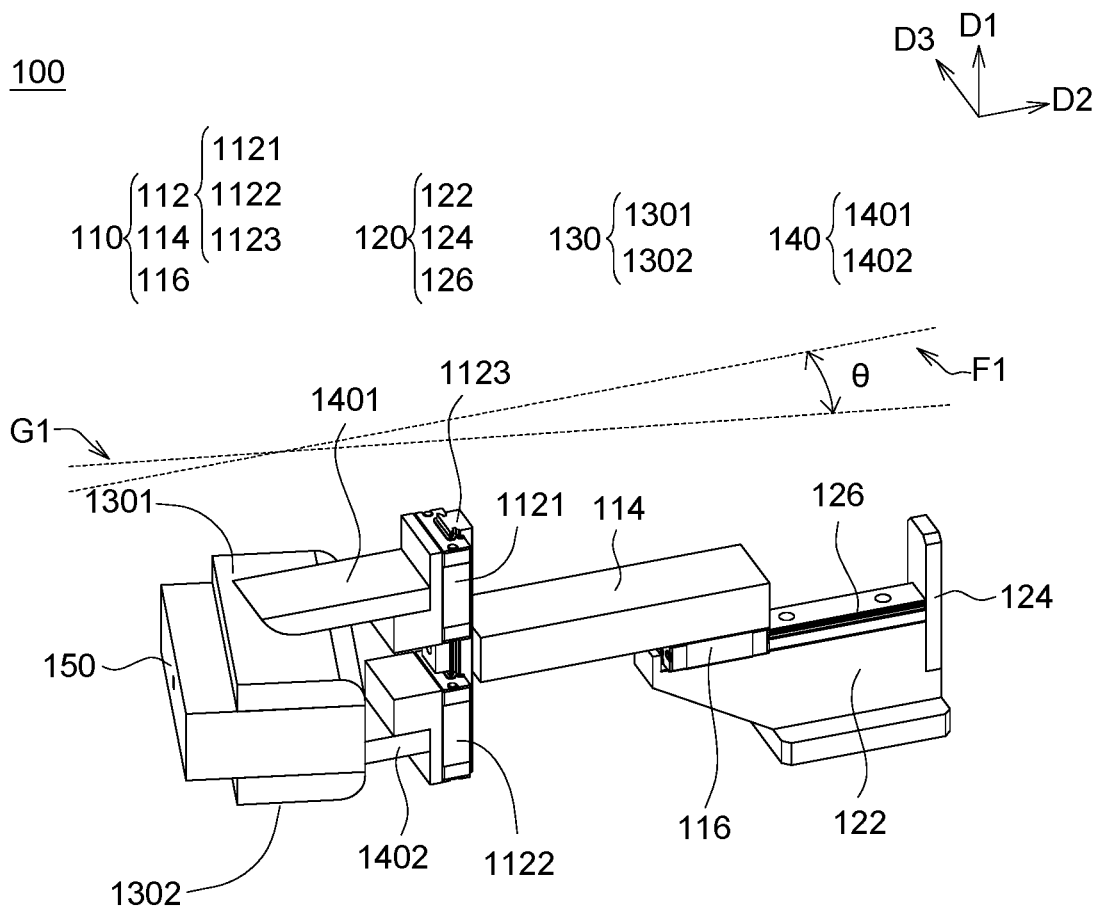
FIG. 5B illustrates a stereo view of the docking structure included in the docking device when a rotation error occurs.
Figure 6A:
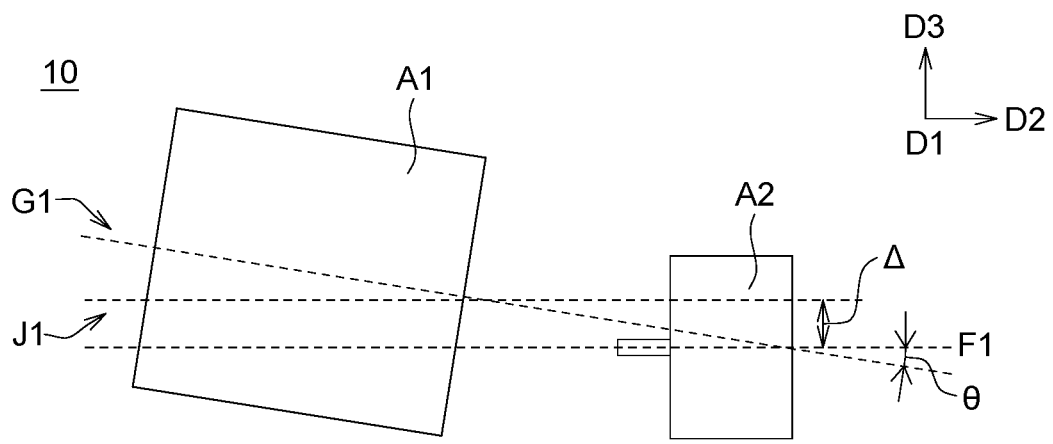
FIG. 6A illustrates a top view of the docking device when a translation error and a rotation error occur.
Figure 6B:
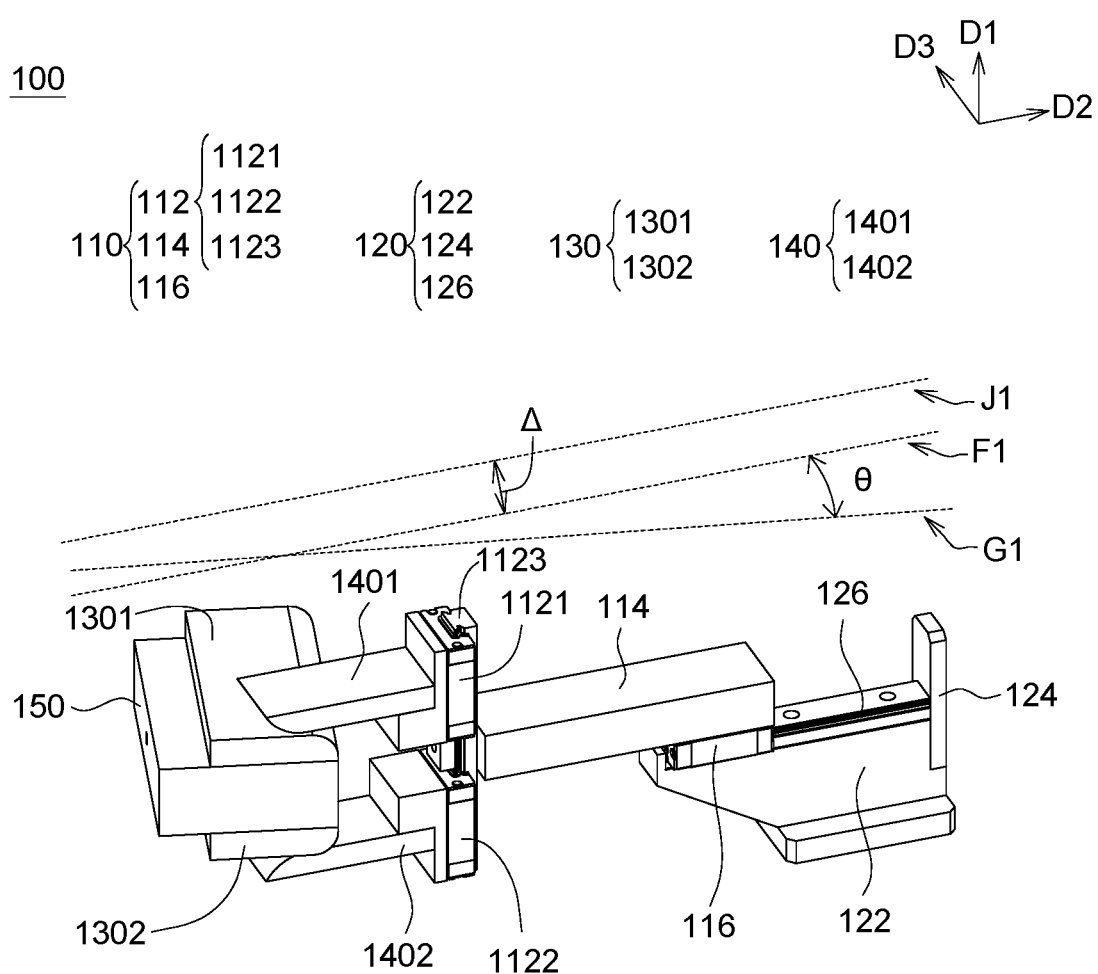
FIG. 6B illustrates a stereo view of the docking structure included in the docking device when a translation error and a rotation error occur.

For example, when there is a docking error in the process of docking the first electrode group 130 and the second electrode group 140, the docking error can be a translation error (as shown in FIGS. 4A-4B), a rotation error (as shown in FIG. 5A-5B) or a combination of the translation error and rotation error (as shown in FIGS. 6A-6B).

Please refer to FIGS. 4A-4B. FIG. 4A illustrates a top view of the docking device 10 when a translation error occurs. FIG. 4B illustrates a stereo view of the docking structure 100 included in the docking device 10 when there is a translation error. As shown in FIG. 4A, when the autonomous vehicle A1 is about to dock with the service station A2, there is a positioning error. The central symmetry axis G1 and the central symmetry axis F1 do not coincide with each other, but are separated from each other in the third direction D3. The extension direction of the central symmetry axis G1 and the extension direction of the central symmetry axis F1 may still be parallel to each other (e.g. parallel to the second direction D2). For example, there is a translation error value Δ between the central symmetry axis G1 and the central symmetry axis F1 in the third direction D3. The central symmetry axis G1 represents the central symmetry axis of the first electrode group 130 (including the first upper electrode 1301 and the first lower electrode 1302), and the central symmetry axis F1 represents the central symmetry axis of the second electrode group 140 (including the second upper electrode 1401 and the second lower electrode 1402). As shown in FIG. 4B, when there is a translation error between the first electrode group 130 and the second electrode group 140, there may be a translation error value Δ between the central symmetry axis G1 of the first upper electrode 1301 and the first lower electrode 1302 and the central symmetry axis F1 of the second upper electrode 1401 and the second lower electrode 1402 in the third direction D3.

Please refer to FIGS. 5A-5B. FIG. 5A illustrates a top view of the docking device 10 when there is a rotation error. FIG. 5B illustrates a stereo view of the docking structure 100 included in the docking device 10 when there is a rotation error. As shown in FIG. 5A, when the autonomous vehicle A1 is about to dock with the service station A2, a positioning error occurs. The central symmetry axis G1 and the central symmetry axis F1 do not coincide with each other, nor are they parallel to each other, but intersect each other. For example, there may be a rotation error angle θ between the central symmetry axis G1 and the central symmetry axis F1. The central symmetry axis G1 represents the central symmetry axis of the first electrode group 130 (including the first upper electrode 1301 and the first lower electrode 1302), and the central symmetry axis F1 represents the second electrode group 140 (including the second upper electrode 1401 and the second lower electrode 1402). As shown in FIG. 5B, when there is a rotation error between the first electrode group 130 and the second electrode group 140, there may be a rotation error angle θ between the central symmetry axis G1 of the first upper electrode 1301 and the first lower electrode 1302 and the central symmetry axis F1 of the second upper electrode 1401 and the second lower electrode 1402.

Please refer to FIGS. 6A-6B. FIG. 6A illustrates a top view of the docking device 10 when a translation error and a rotation error occur. FIG. 6B illustrates a stereo view of the docking structure included in the docking device when a translation error and a rotation error occur. As shown in FIG. 6A, when the autonomous vehicle A1 is about to dock with the service station A2, there is a positioning error, and the central symmetry axis G1 and the central symmetry axis F1 do not coincide with each other, nor are they parallel to each other, but intersect each other. For example, there may be a rotation error angle θ between the central symmetry axis G1 and the central symmetry axis F1. Moreover, there is also a translation error between the central symmetry axis G1 and the central symmetry axis F1. In the present embodiment, the translation error value between the central symmetry axis G1 and the central symmetry axis F1 can be measured by defining a horizontal axis J1 passing through the geometric center the first electrode group 130 and extending in a direction parallel to the second direction D2 (that is, parallel to the central symmetry axis F1). The translation error value between the central symmetry axis G1 and the central symmetry axis F1 in the third direction D3 is the translation error value Δ between the horizontal axis J1 and the central symmetry axis F1 in the third direction D3. It should be understood that the angle formed between the central symmetry axis G1 and the horizontal axis J1 is also the rotation error angle θ. The central symmetry axis G1 represents the central symmetry axis of the first electrode group 130 (including the first upper electrode 1301 and the first lower electrode 1302), and the horizontal axis J1 represents the horizontal axis passing through the geometric center of the first electrode group 130 and extending in a direction parallel to the second direction D2 (i.e., parallel to the central symmetry axis F1). The central symmetry axis F1 represents the central symmetry axis of the second electrode group 140 (including the second upper electrode 1401 and the second lower electrode 1402). As shown in FIG. 6B, when a translation error and a rotation error occur between the first electrode group 130 and the second electrode group 140, there may be a rotation error angle θ between the central symmetry axis G1 and the central symmetry axis F1, and there may be a translation error value Δ between the horizontal axis J1 and the central symmetry axis F1 in the third direction D3.

Figure 7:
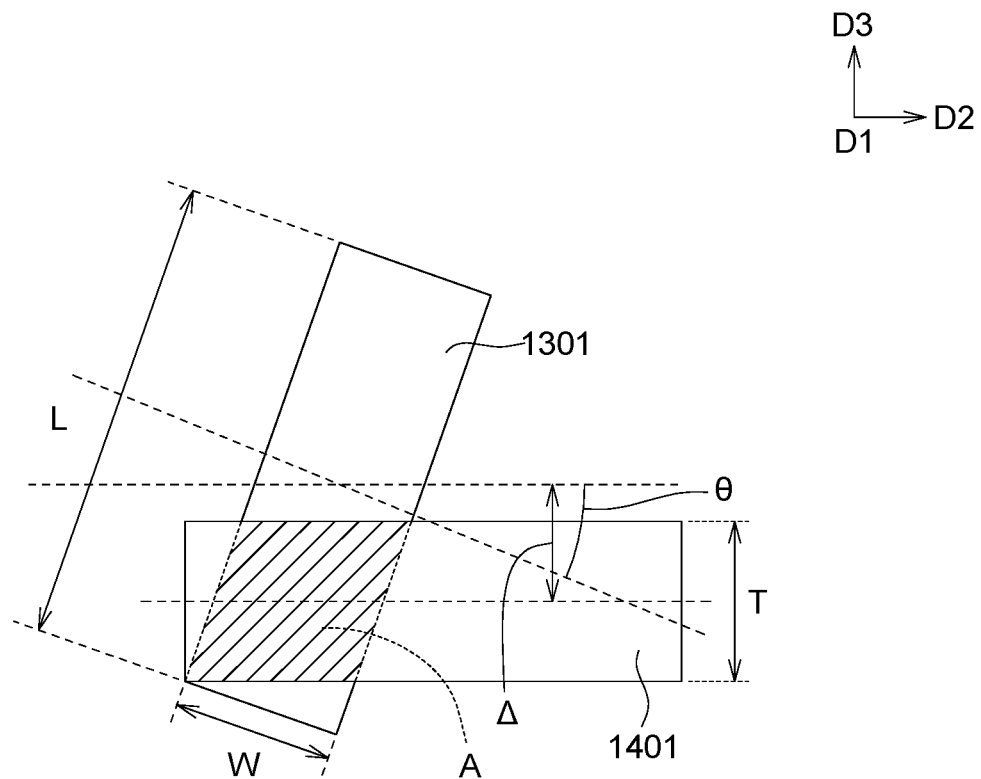
FIG. 7 illustrates a simplified top view of a single-sided electrode of the first electrode group and a single-sided electrode of the second electrode group when a docking error as shown in FIG. 6B occurs.

FIG. 7 illustrates a simplified top view on the D2-D3 plane of a single-sided electrode of the first electrode group 130 (for example, the first upper electrode 1301) and a single-sided electrode of the second electrode group 140 (for example, the second upper electrode 1401) when a docking error as shown in FIG. 6B occurs.

Please refer to FIG. 7, the docking error satisfies the following

Formula 1 and Formula 2:

$$L = 2\left(\Delta \cos\theta + W \tan\theta + \frac{T}{2\cos\theta}\right) \quad \text{Formula 1}$$

$$A = \frac{T}{\cos\theta} \times W \quad \text{Formula 2}$$

In Formula 1 and Formula 2, L represents a length of a single-sided electrode of the first electrode group 130 on the D2-D3 plane (such as the length of the first upper electrode 1301); W represents a width of the single-sided electrode of the first electrode group 130 on the D2-D3 plane; T represents a width of a single-sided electrode of the second electrode group 140 on the D2-D3 plane (such as the width of the second upper electrode 1401); A represents a contact area in a single side between the first electrode group 130 and the second electrode group 140 on the D2-D3 plane (such as the contact area between the first upper electrode 1301 and the second upper electrode 1401); A represents a translation error value between the first electrode group 130 and the second electrode group 140 (such as the translation error value between the first upper electrode 1301 and the second upper electrode 1401); θ represents a rotation error angle between the first electrode group 130 and the second electrode group 140 (such as the rotation error angle between the first upper electrode 1301 and the second upper electrode 1401), as shown in FIG. 7.

In the embodiment as shown in FIGS. 5A-5B, since the docking error comprises the rotation error but not the translation error, Δ in Formula 1 and Formula 2 is equal to 0, and θ is greater than 0.

In the embodiment as shown in FIGS. 6A-6B, since the docking error comprises the translation error and the rotation error, Δ in Formula 1 and Formula 2 is greater than 0, and θ is greater than 0.

Figure 8A:
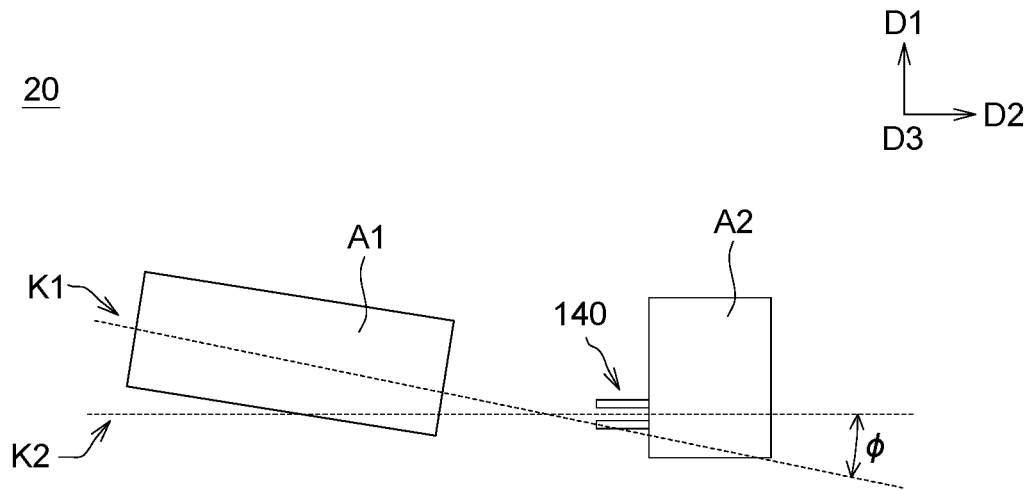
FIG. 8A illustrates a side view of a docking device according to a further embodiment of the present disclosure when a horizontal error occurs.
Figures 8B, 8C:
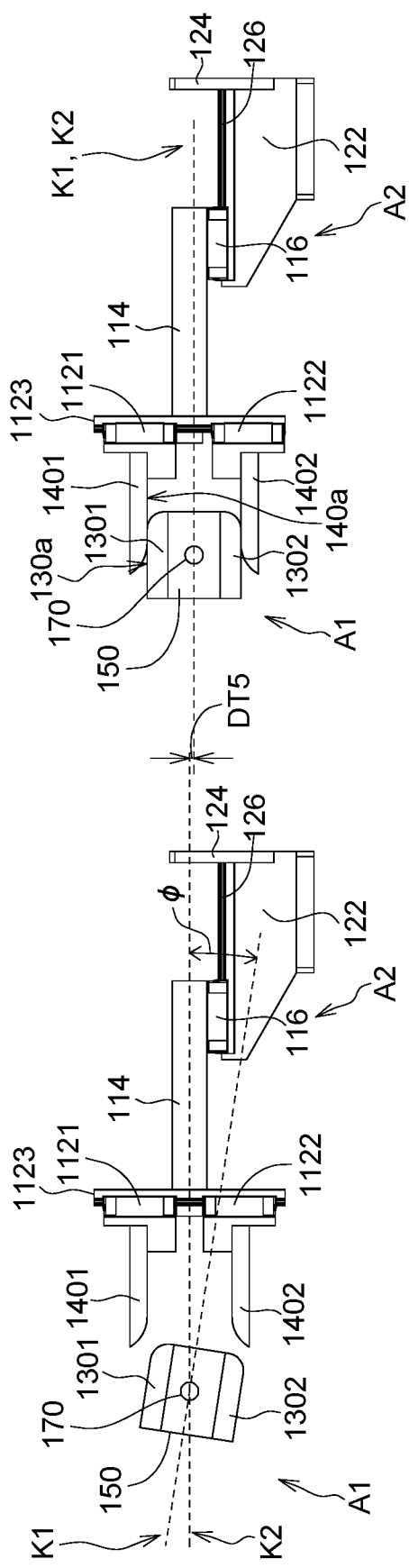
FIGS. 8B-8C illustrate side views of a docking structure included in a docking device according to a further embodiment of the present disclosure.

According to an embodiment, when a docking error occurs during the docking process of the first electrode group 130 and the second electrode group 140, the docking error further comprises a horizontal error (as shown in FIGS. 8A-8C).

FIG. 8A illustrates a side view of a docking device 20 according to a further embodiment of the present disclosure when a horizontal error occurs. FIGS. 8B-8C illustrate side views of a docking structure 500 included in a docking device 20 according to a further embodiment of the present disclosure, especially illustrating the steps of docking the first electrode group 130 and the second electrode group 140 in the docking structure 500 in sequence. The docking structure 500 can be similar to the docking structures 100-400 respectively, one of the differences is that the docking structure 500 further comprises the rotation shaft 170; one of the differences between the docking device 20 and the docking device 10 is that the docking structure 500 further comprises the rotation shaft 170, and the repeated part will not be repeated here. The illustration of the first elastic structure and the second elastic structure are omitted in the docking structure 500. It should be understood that, in the present embodiment, the first electrode group 130, the insulating block 150 and the rotation shaft 170 are disposed on the autonomous vehicle A1, and the second electrode group 140, the first base 110 and the second base 120 are disposed on the service station A2, but the present disclosure is not limited thereto. According to another embodiment, the first electrode group 130, the insulating block 150 and the rotating shaft 170 are disposed on the service station A2, and the second electrode group 140, the first base 110 and the second base 120 are disposed on the autonomous vehicle A1.

As shown in FIG. 8A, there is a horizontal error when the autonomous vehicle A1 and the service station A2 are docked, for example, the autonomous vehicle A1 is tilted towards the service station A2, resulting in the symmetry axis K1 between the first electrode group 130 (not shown in FIG. 8A) and the symmetry axis K2 between the second electrode group 140 intersect each other, so that there is a horizontal error angle ø between the symmetry axes K1 and K2. The horizontal error angle ø tolerable for the docking structure 500 can be adjusted according to design requirements, and the present disclosure is not limited to a specific range of the horizontal error angle. Wherein, the first upper electrode 1301 and the first lower electrode 1302 are symmetrical to each other along the symmetry axis K1 and the second upper electrode 1401 and the second lower electrode 1402 are symmetrical to each other along the symmetry axis K2.

As shown in FIGS. 8B-8C, the docking structure 500 comprises a rotation shaft 170. The insulating block 150 is pivotally connected to the rotation shaft 170 to provide freedom for the first electrode group 130 regarding the third direction D3 as a rotation axis. The first upper electrode 1301 and the first lower electrode 1302 of the first electrode group 130 can be driven to rotate together by the rotation shaft 170.

Please refer to FIG. 8B, when the first electrode group 130 is close to the second electrode group 140 for docking, there is a horizontal error between the first electrode group 130 and the second electrode group 140, the symmetry axis K1 between the first upper electrode 1301 and the first lower electrode 1302 and the symmetry axis K2 between the second upper electrode 1401 and the second lower electrode 1402 intersect with each other, and there is a horizontal error angle ø between the symmetry axes K1 and K2.

Please refer to FIG. 8C, when the first electrode group 130 enters the space between the second electrode group 140, the first upper electrode 1301 and the first lower electrode 1302 of the first electrode group 130 are driven to rotate together by the rotation shaft 170, so that a parallel surface contact between the first plane 130a of the first electrode group 130 and the second plane 140a of the second electrode group 140 can be maintained. That is, the surface contact between the upper surface of the first upper electrode 1301 and the lower surface of the second upper electrode 1401 is maintained, the surface contact between the lower surface of the first lower electrode 1302 and the upper surface of the second lower electrode 1402 is maintained, and the upper surface of the first upper electrode 1301, the lower surface of the second upper electrode 1401, the lower surface the first lower electrode 1302 and the upper surface of the second lower electrode 1402 are parallel to each other. In the present embodiment, the symmetry axes K1 and K2 as shown in FIG. 8C coincide with each other, and there is a translation distance DT5 in the first direction D1 between the symmetry axes K1 and K2 as shown in FIG. 8C and the symmetry axis K2 as shown in FIG. 8B. It can be seen that since the docking structure 500 comprises the rotation shaft 170, the first electrode group 130 can be rotated to adjust to a horizontally appropriate docking position, so the horizontal error angle ø between the first electrode group 130 and the second electrode group 140 can be tolerated.

In general, compared with the comparative example of the docking structure in which surface contact cannot be maintained between the two electrode groups, since the docking structure of the present disclosure comprises two electrode groups (for example, the first electrode group and the second electrode group) arranged in parallel to each other and elastic structures (such as the first elastic structure and the second elastic structure), the parallel surface contact between the first electrode group and the second electrode group can still be maintained under the circumstance that the docking error occurs, so that there is a larger contact area between the first electrode group and the second electrode group, so it can have better charging efficiency or information transmission efficiency. That is, the tolerance for docking errors is improved.

In sum, although the present disclosure has been disclosed above with embodiments, it is not intended to limit the present disclosure. Those skilled in the art may make various modifications and variations without departing from the spirit and scope of the present disclosure. Therefore, the scope of protection of the present disclosure should be defined by the scope of the following claims.

What is claimed is:

1. A docking structure, comprising:
a first base and a second base connected to the first base;
a first electrode group arranged in parallel and combined on an insulating block; and
a second electrode group arranged in parallel with the first electrode group, wherein the second electrode group is used for bonding the first electrode group, the second electrode group is combined with the first base and has freedom in a first direction, and moves in the first direction by a first elastic structure; the first base is combined with the second base and has freedom in a second direction different from the first direction, wherein a second elastic structure is connected between the first base and the second base;
wherein a first plane of the first electrode group and a second plane of the second electrode group are kept in parallel surface contact during docking the first electrode group and the second electrode group.

2. The docking structure according to claim 1, wherein the first elastic structure comprises an elastic recovery mechanism, so that there is a contact force between the first plane and the second plane.

3. The docking structure according to claim 1, wherein the first electrode group comprises a first upper electrode and a first lower electrode, and the second electrode group comprises a second upper electrode and a second lower electrode, the first upper electrode corresponds to the second upper electrode, and the first lower electrode corresponds to the second lower electrode.

4. The docking structure according to claim 3, wherein the first base comprises a clamping portion, a rod-shaped portion and a protruding portion, and a first end of the rod-shaped portion is connected to the clamping portion, a second end of the rod-shaped portion is connected to the protruding portion, the first end is opposite to the second end, and the first end is closer to the second electrode group than the second end.

5. The docking structure according to claim 4, wherein the second base comprises a body portion, a fixing portion and a groove,
wherein the groove is formed on an upper side of the body portion to allow the protruding portion to slide, the body portion has a front end and a rear end opposite to the front end, and the front end is closer to the second electrode group than the rear end, and
the fixing portion is connected to the rear end.

6. The docking structure according to claim 5, wherein the clamping portion comprises an upper clamping member and a lower clamping member, and the upper clamping member and the lower clamping member are connected to the second upper electrode and the second lower electrode, respectively.

7. The docking structure according to claim 6, wherein the first elastic structure is connected to the upper clamping member and the lower clamping member.

8. The docking structure according to claim 6, wherein the first elastic structure comprises an upper elastic member and a lower elastic member, and the clamping portion further comprises an extension pillar extending along the first direction, the upper elastic member is connected to the upper clamping member and the extension pillar, the lower elastic member is connected to the lower clamping member and the extension pillar, alternatively, the upper elastic member is connected to the second upper electrode and the extension pillar, the lower elastic member is connected to the second lower electrode and the extension pillar.

9. The docking structure according to claim 6, wherein the clamping portion further comprises an extension pillar extending along the first direction, the upper clamping member and the lower clamping member are movably engaged with the extension pillar, and the second elastic structure is connected to the body portion and the extension pillar.

10. The docking structure according to claim 5, wherein the second elastic structure is connected to the rod-shaped portion and the fixing portion.

11. The docking structure according to claim 1, wherein when a docking error occurs during a docking process of the first electrode group and the second electrode group, the docking error is a translation error, a rotation error or a combination of the translation error and the rotation error.

12. The docking structure according to claim 1, wherein the docking error satisfies the following Formula 1 and Formula 2:

$$L = 2\left(\Delta \cos\theta + W \tan\theta + \frac{T}{2\cos\theta}\right); \quad \text{Formula 1}$$

$$A = \frac{T}{\cos\theta} \times W; \quad \text{Formula 2}$$

wherein, L represents a length of a single-sided electrode of the first electrode group; W represents a width of the single-sided electrode of the first electrode group; T represents a width of a single-sided electrode of the second electrode group; A represents a contact area in a single side between the first electrode group and the second electrode group; Δ represents a translation error value between the first electrode group and the second electrode group; θ represents a rotation error angle between the first electrode group and the second electrode group.

13. The docking structure according to claim 11, wherein when there is a docking error during the docking process of the first electrode group and the second electrode group, the docking error further comprises a horizontal error.

14. The docking structure according to claim 1, further comprising a rotation shaft to provide freedom for the first electrode group regarding a third direction as a rotation axis, wherein the third direction is different from the first direction and the second direction.

15. The docking structure according to claim 1, wherein a normal direction of the first plane is parallel to the first direction.

16. A docking device, comprising:
an autonomous vehicle and a service station, the autonomous vehicle moving towards the service station, making the autonomous vehicle and the service station docking with each other; and
a docking structure, comprising:
a first base and a second base connected to the first base;
a first electrode group arranged in parallel and combined on an insulating block; and
a second electrode group arranged in parallel with the first electrode group, wherein the second electrode group is used for bonding the first electrode group, the second electrode group is combined with the first base and has freedom in a first direction, and moves in the first direction by a first elastic structure; the first base is combined with the second base and has freedom in a second direction different from the first direction, wherein a second elastic structure is connected between the first base and the second base;
wherein a first plane of the first electrode group and a second plane of the second electrode group are kept in parallel surface contact during docking the first electrode group and the second electrode group;
wherein the first electrode group is disposed on the autonomous vehicle, the second electrode group, the first base and the second base are disposed on the service station, or
the first electrode group is disposed on the service station, and the second electrode group, the first base and the second base are disposed on the autonomous vehicle.

* * * * *